United States Patent
Palakkal et al.

(10) Patent No.: US 11,879,916 B2
(45) Date of Patent: Jan. 23, 2024

(54) METHOD AND ELECTRONIC DEVICE FOR ESTIMATING FREQUENCIES OF MULTIPLE SINUSOIDS WHICH TRADES BIAS WITH VARIANCE

(71) Applicant: Indian Institute of Technology Madras (IIT Madras), Chennai (IN)

(72) Inventors: Vishnu Palakkal, Malappuram (IN); Coimbatore Subramanian Ramalingam, Chennai (IN)

(73) Assignee: INDIAN INSTITUTE OF TECHNOLOGY MADRAS (IIT MADRAS), Chennai (IN)

( * ) Notice: Subject to any disclaimer, the term of this patent is extended or adjusted under 35 U.S.C. 154(b) by 0 days.

(21) Appl. No.: 17/906,411

(22) PCT Filed: Mar. 18, 2021

(86) PCT No.: PCT/IN2021/050279
§ 371 (c)(1),
(2) Date: Sep. 15, 2022

(87) PCT Pub. No.: WO2021/199066
PCT Pub. Date: Oct. 7, 2021

(65) Prior Publication Data
US 2023/0176099 A1    Jun. 8, 2023

(51) Int. Cl.
*G01R 23/16*    (2006.01)
*G01R 23/02*    (2006.01)
*G06F 17/18*    (2006.01)

(52) U.S. Cl.
CPC ............ *G01R 23/16* (2013.01); *G01R 23/02* (2013.01); *G06F 17/18* (2013.01)

(58) Field of Classification Search
CPC .......... G01R 23/16; G01R 23/02; G06F 17/18
See application file for complete search history.

(56) References Cited

PUBLICATIONS

Vishnu, P. et al. "An Improved LSF-Based Algorithm for Sinusoidal Frequency Estimation that achieves Maximum Likelihood Performance", Sep. 24, 2020, 2020 International Conference on Signal Processing and Communications (SPCOM).*

(Continued)

*Primary Examiner* — Manuel L Barbee

(57) ABSTRACT

Accordingly embodiments herein disclose a method for estimating frequencies of multiple sinusoids by an electronic device (100). The method includes receiving a signal, where the signal comprises the multiple sinusoids. Further, the method includes estimating an initial frequency of each of the multiple sinusoids present in the received signal, determining that a first candidate parameter is less than zero, where the candidate parameter is a function of an estimated Signal-to-noise ratio (SNR) and an estimated threshold. Further, the method includes performing zero-padding on the received signal. Further, the method includes re-estimating frequencies obtained from zero-padded version of the received signal. Further, the method includes validating the re-estimated frequencies obtained from zero-padded version of the received signal based on validation criteria. Further, the method includes predicting the re-estimated frequencies or the initial frequencies as optimal frequencies based on the validation. Further, the method includes refining re-estimated frequencies using iterative filtering.

20 Claims, 5 Drawing Sheets

(56) References Cited

PUBLICATIONS

Aboutanios, Elias. "Estimating the Parameters of Sinusoids and Decaying Sinusoids in Noise", Apr. 2011, IEEE Instrumentaiton & Measurement Magazine, vol. 14, No. 2, pp. 8-14.*

* cited by examiner (a)

(b)

(a)

(b)

(a)

(b)

METHOD AND ELECTRONIC DEVICE FOR ESTIMATING FREQUENCIES OF MULTIPLE SINUSOIDS WHICH TRADES BIAS WITH VARIANCE

PRIORITY DETAILS

The present application is based on, and claims priority from International Application PCT/IN2021/050279 filed 18 Mar. 2021 and Indian Application Number 202041014919 filed on 3 Apr. 2020, the disclosures of which are hereby incorporated by reference herein.

TECHNICAL FIELD

This embodiment relates to wireless communication, and more particularly to a method and electronic device for estimating frequencies of multiple sinusoids.

BACKGROUND

Estimating frequencies of multiple sinusoids present in a noisy signal is commonly accomplished by subspace-based methods such as Estimation of Signal Parameters via Rotational Invariance Technique (ESPRIT), Multiple Signal Classification (MUSIC), Minimum Norm (Min-Norm), etc. The subspace-based methods do not assume that the data are zero outside an observation interval. If the data are assumed to be zero outside the observation interval, threshold SNR (i.e., the Signal-to-Noise Ratio below which the variance of the estimates registers a sharp increase, caused by a rapid increase in the number of outliers) is lowered significantly, but price paid is unacceptable bias. Among all known unbiased estimators, a Maximum Likelihood (ML) estimator has the lowest threshold but is computationally the most expensive.

Further, the problem of estimating the parameters of multiple sinusoids assumes the presence of Additive white Gaussian noise (AWGN). The noisy observed data, consisting of p complex sinusoids, can be modeled as shown in an equation (1), $$x[n]=\Sigma_{l=1}^{P}v_{l}e^{j2\pi f_{l}n}+w[n]\ n=0,1,\ldots,N-1 \quad (1)$$

The complex amplitudes $v_l(=|v_l|e^{j\phi_l})$'s and the frequencies $f_l$'s are the unknowns; p is assumed to be known. If the $\phi_l$'s are assumed to be random and uniformly distributed in the interval $[0,2\pi]$, the autocorrelation sequence (ACS) has the form as shown in the equation (2), $$r_{xx}[k]=\Sigma_{l=1}^{P}P_l e^{j2\pi f_l k}+\sigma_w^2\delta[k] \quad (2)$$

Where $P_l=|v_l|^2$ and $\sigma_w^2$ is the noise variance. The eigenstructure of the associated M×M autocorrelation matrix $R_{xx}$ is exploited by the so-called subspace-based methods. Since the true ACS is not known, $r_{xx}[k]$ are estimated from the given finite data set. Depending on the assumption, the estimated ACS can be labeled as being either "autocorrelation" (x[n]=0 outside the observation window) or "covariance" (no such assumption is made about x[n]).

The ML estimator has the lowest threshold SNR. The disadvantage is that ML is computationally the most burdensome. Subspace-based methods are a good compromise between computational burden and reasonably low (but higher-than-ML) threshold SNR. Hitherto, all the subspace-based methods have used the "covariance" assumption. The "autocorrelation" assumption (i.e., the assumption of zeros outside the given observation interval) is not used because the estimates have an unacceptable bias even in the noiseless case.

The "autocorrelation" assumption leads to estimates that are biased, but their variance is noticeably lower. The question that naturally arises is whether the bias can be reduced to within acceptable limits while retaining the relatively lower variance of these estimates.

Consider the well-known two-sinusoid example with N=25, $f_1$=0.52, $f_2$=0.5, $|v_1|=|v_2|$=1, and $\phi_1-\phi_2$=0. Conventional Estimation of Signal Parameters via Rotational Invariance Technique (ESPRIT) uses the "forward-backward approach" to estimate $\hat{R}_{xx}$ (size M×M) by making no assumption about x[n] outside an observation window. On the other hand, if one assumes that given data are zero outside the observation window, one can use the zero-padded data for frequency estimation. Designate this method as ESPRIT-AC. It is easy to see that ESPRIT-AC is nothing but the conventional ESPRIT operating on $y=[0\times0]^T$ (where 0 is of size M×1).

The notation "a" in a FIG. 1 shows the histogram of $\hat{f}_2$ (based on 50000 trials) obtained for a Signal-to-Noise Ratio (SNR)=5 dB (well below ESPRIT's threshold). As expected, there are many outliers. The notation "b" in the FIG. 1 shows the histogram of $\hat{f}_2$ obtained using ESPRIT-AC with much smaller variance, but is clearly biased. For this SNR, the bias was found to be 0.0034, which may be deemed as acceptable.

However, the bias remains more or less constant even for high SNRs and dominates the Mean Squared Error (MSE), as can be seen from a FIG. 2. The notation "a" in the FIG. 2 shows that ESPRIT-AC has a threshold that is lower than a Maximum Likelihood (ML) threshold. But the unacceptable bias (the notation "b" in the FIG. 2) makes the method unusable in its current form. Therefore, switch to ESPRIT-AC for low SNRs, while striving to keep the bias to within acceptable levels. As a result, additional computational cost occurs. In the high SNR regime ESPRIT's estimates are nearly optimal. Hence, another desirable feature would be to switch to conventional ESPRIT for high SNRs to save computation cost. Ideally, the switching should be done whenever the SNR is above ESPRIT's threshold. But neither the SNR nor the threshold is known in practice.

Thus, it is desired to address the above mentioned disadvantages or other shortcomings or at least provide a useful alternative.

SUMMARY

Accordingly, embodiments herein disclose a method for estimating frequencies of multiple sinusoids. The method includes receiving, by an electronic device, a signal, where the signal comprises multiple sinusoids. Further, the method includes estimating, by the electronic device, initial frequency (i.e., $\hat{f}_k$) of each of the multiple sinusoids present in the received signal for k=1,2, ..., p. Further, the method includes determining, by the electronic device, that a first candidate parameter (i.e. $\Gamma_\beta$) is less than zero, where the candidate parameter is a function of an estimated Signal-to-noise ratio (SNR) and an estimated threshold. Further, the method includes performing, by the electronic device, zero-padding on the received signal. Further, the method includes re-estimating, by the electronic device, frequencies obtained from the zero-padded version of the received signal. Further, the method includes validating, by the electronic device, the re-estimated frequencies (i.e., $\hat{f}_{zp}$, where the subscript k has been omitted for ease of notation) obtained from zero-padded version of the received signal based on a validation criteria. Further, the method includes predicting, by the electronic device, the re-estimated frequencies or the initial frequencies as the optimal frequencies based on the validation.

In an embodiment, the method includes applying, by the electronic device, a likelihood function on the estimated initial frequencies and the re-estimated frequencies. Further, the method includes determining, by the electronic device, value of the likelihood function evaluated at the estimated initial frequencies (i.e., L) and value of the likelihood function evaluated at the re-estimated frequencies (i.e., $L_{zp}$). Further, the method includes performing either determining, by the electronic device, a closeness between the estimated initial frequencies and the re-estimated frequencies when the value of the likelihood function evaluated at the estimated initial frequencies is lower than the value of the likelihood function evaluated at the re-estimated frequencies or determining, by the electronic device, the re-estimated frequencies as the optimal frequencies when the value of the applied likelihood function evaluated at the estimated initial frequencies is higher than the value of the likelihood function evaluated at the re-estimated frequencies.

In an embodiment, the method includes determining, by the electronic device, a peak absolute difference between the estimated initial frequencies and the re-estimated frequencies (i.e., $\|\hat{f}-\hat{f}_{zp}\|_\infty$). Further the value of the likelihood function evaluated at the estimated initial frequencies is modified with a third candidate parameter (i.e., r). Further, the method includes performing either determining, by the electronic device, the estimated initial frequencies as the optimal frequencies when the peak absolute difference is lower than a specified threshold value (i.e., $\Delta_f$) or determining, by the electronic device, whether a second candidate parameter (i.e., $\Gamma_{\beta,zp}$) value is higher than the first candidate parameter value and the modified value of the likelihood function evaluated at the estimated initial frequencies is higher than the value of the likelihood function evaluated at the re-estimated frequencies when the peak absolute difference is higher than a specified threshold value.

In an embodiment, the method includes performing either applying, by the electronic device, an iterative filtering when the second candidate parameter value is lower than the first candidate parameter value or the modified value of the likelihood function evaluated at the estimated initial frequencies is lower than the value of the likelihood function evaluated at the re-estimated frequencies or determining, by the electronic device, the re-estimated frequencies as the optimal frequencies when the second candidate parameter value is higher than the first candidate parameter value and the modified value of the likelihood function evaluated at the estimated initial frequencies is higher than the value of the likelihood function evaluated at the re-estimated frequencies. The iterative filtering refines the re-estimated frequencies to obtain the optimal frequencies.

In an embodiment, the iterative filtering includes determining a subset of at least one re-estimated frequencies as optimal sinusoids, removing the determined optimal sinusoids from the received signal, re-estimating frequencies of the remaining sinusoids of the received signal, combining the determined frequencies and re-estimated frequencies of the remaining sinusoids, applying gradient using the combined frequencies set as the initial guess, exhaustively cycle through all possible subsets, and determine final estimate based on likelihood function evaluation.

In an embodiment, estimating the initial frequencies using the existing subspace method, where the existing subspace method comprises an Estimation of Signal Parameters via Rotational Invariance Technique (ESPRIT), a Multiple Signal Classification (MUSIC), a Minimum-Norm (Min-Norm).

In an embodiment, the zero-padding added at either end of the received signal or at both ends of the received signal.

In an embodiment, the method includes determining, by the electronic device, energy levels of first few samples and last few samples of the estimated frequencies. Further, the method includes zero-padding, by the electronic device, at left side of the received signal when the energy levels of the first few samples is lower than the energy levels of the last few samples. Further, the method includes zero-padding, by the electronic device, at right side of the received signal when the energy levels of the first few samples is higher than the energy levels of the last few samples. Further, the method includes zero-padding at both sides of the received signal, by the electronic device, when the second candidate parameter value is less than zero. Further, the method includes zero-padding at both sides of the received signal, by the electronic device, is not required when the second candidate parameter value is greater than zero.

Accordingly, the embodiments herein provide an electronic device for estimating frequencies of multiple sinusoids. The electronic device includes a frequency estimator engine coupled with a processor and a memory. The frequency estimator engine is configured to receive a signal and estimate an initial frequency of each of the multiple sinusoids present in the received signal. Further, the frequency estimator engine is configured to determine that a first candidate parameter is less than zero, where the candidate parameter is a function of an estimated SNR and an estimated threshold. Further, the frequency estimator engine is configured to perform zero-padding on the received signal. Further, the frequency estimator engine is configured to re-estimate frequencies obtained from zero-padded version of the received signal. Further, the frequency estimator engine is configured to validate the re-estimated frequencies obtained from zero-padded version of the received signal based on validation criteria. Further, the frequency estimator engine is configured to decide whether the re-estimated frequencies or the initial frequencies as optimal frequencies based on the validation.

In an embodiment, reason for the using "zero-padded version of the received signal" is, if the terminology "zero-padded received signal" is used, it might be misunderstood to mean that the signal was zero padded prior to receiving it. Further, the proposed method requires two signals, first is a signal, as originally received, and second is the zero-padded version of signal that is created if $\Gamma_\beta<0$.)

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF FIGURES

This method is illustrated in the accompanying drawings, throughout which like reference letters indicate corresponding parts in the various figures. The embodiments herein will be better understood from the following description with reference to the drawings, in which.

DETAILED DESCRIPTION OF INVENTION

Figure 1:
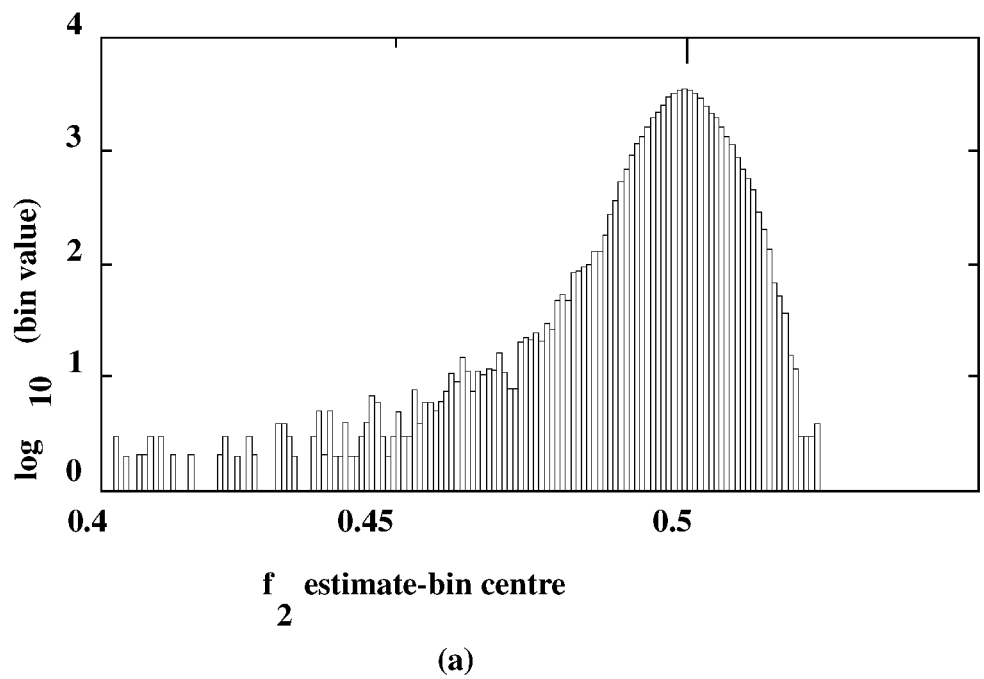
FIG. 1 illustrates a Histogram of $\hat{f}_2$ obtained using an Estimation of Signal Parameters via Rotational Invariance Technique (ESPRIT) and ESPRIT-AC for two-sinusoid ($f_1$=0.52, $f_2$=0.5, $\phi_1$-$\phi_2$=0) at 5 dB Signal-to-Noise Ratio (SNR), according to a prior art disclosed herein.
Figure 1:
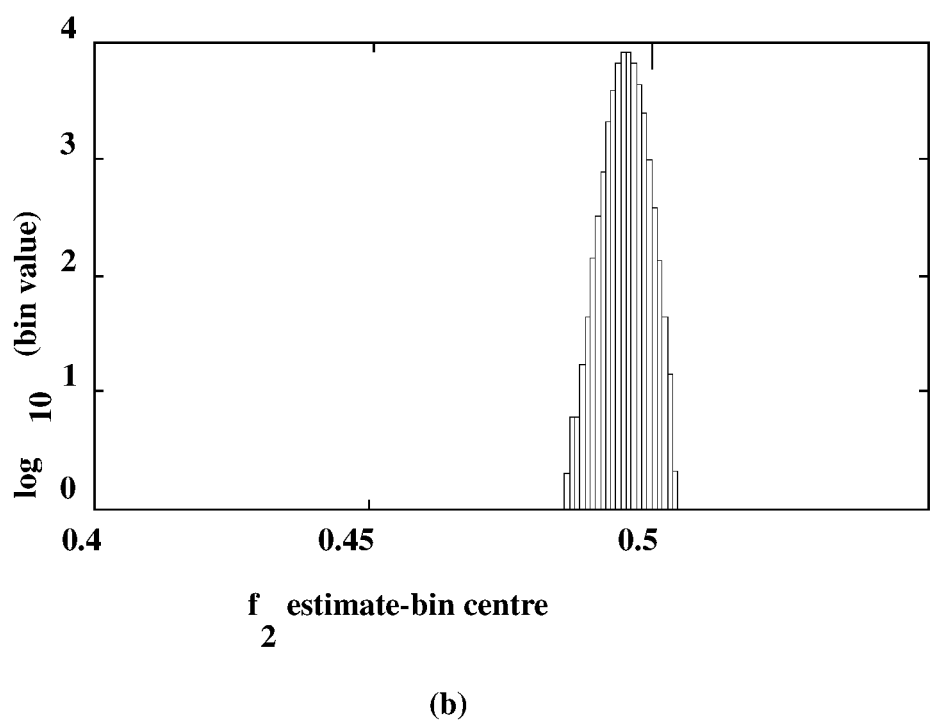
Figure 2:
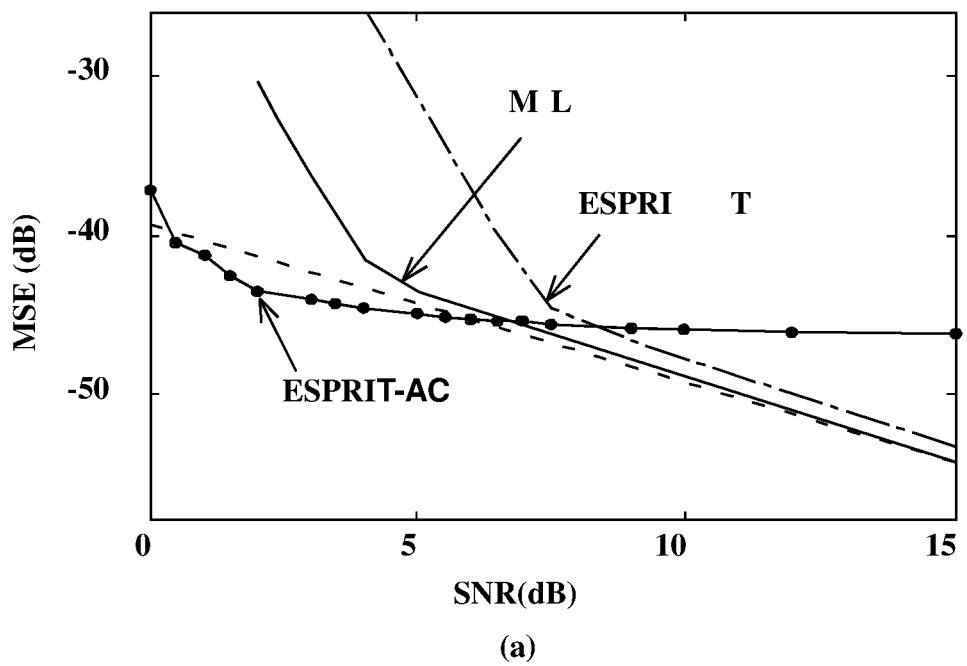
FIG. 2 illustrates a Mean Squared Error (MSE) and bias of Maximum Likelihood (ML), ESPRIT, and ESPRIT-AC for the two-sinusoid, according to a prior art disclosed herein.
Figure 2:
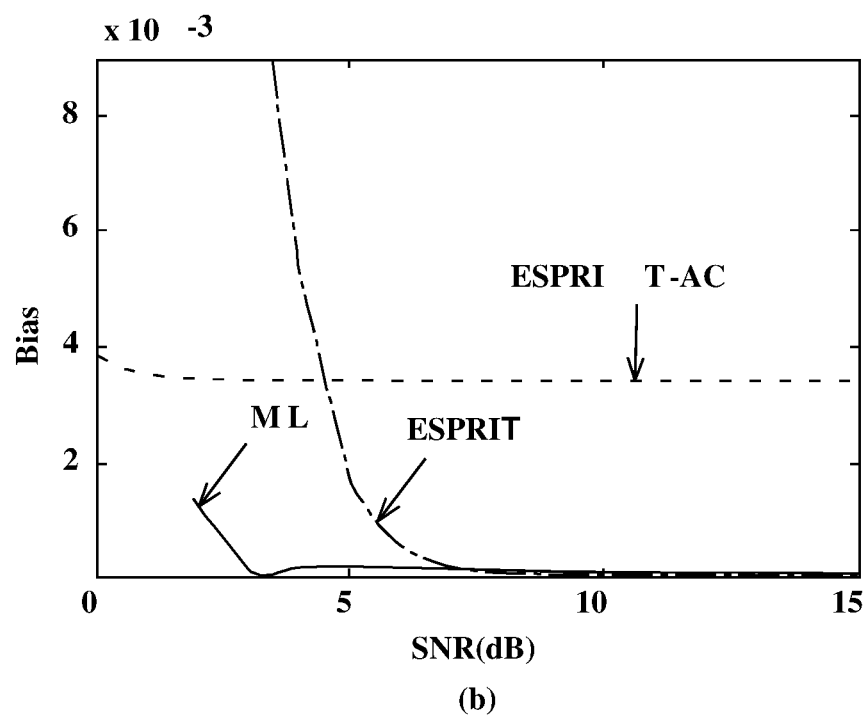

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

As is traditional in the field, embodiments may be described and illustrated in terms of blocks which carry out a described function or functions. These blocks, which may be referred to herein as units or modules or the like, are physically implemented by analog or digital circuits such as logic gates, integrated circuits, microprocessors, microcontrollers, memory circuits, passive electronic components, active electronic components, optical components, hardwired circuits, or the like, and may optionally be driven by firmware and software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the invention. Likewise, the blocks of the embodiments may be physically combined into more complex blocks without departing from the scope of the invention The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings. Although the terms first, second, etc. may be used herein to describe various elements, these elements should not be limited by these terms. These terms are generally only used to distinguish one element from another.

Accordingly, embodiments herein disclose a method for estimating frequencies of multiple sinusoids. The method includes receiving, by an electronic device, a signal, where the signal comprises the multiple sinusoids. Further, the method includes estimating, by the electronic device, an initial frequency (i.e., $\hat{f}$) of each of the multiple sinusoids present in the received signal. Further, the method includes determining, by the electronic device, that a first candidate parameter (i.e., $\Gamma_\beta$) is less than zero, where the candidate parameter is a function of an estimated Signal-to-noise ratio (SNR) and an estimated threshold. Further, the method includes performing, by the electronic device, zero-padding on the received signal. Further, the method includes re-estimating, by the electronic device, frequencies obtained from zero-padded version of the received signal. Further, the method includes validating, by the electronic device, the re-estimated frequencies (i.e., $\hat{f}_{zp}$) obtained from zero-padded version of the received signal based on validation criteria. Further, the method includes predicting, by the electronic device, the re-estimated frequencies or the initial frequencies as optimal frequencies based on the validation.

Figure 3:
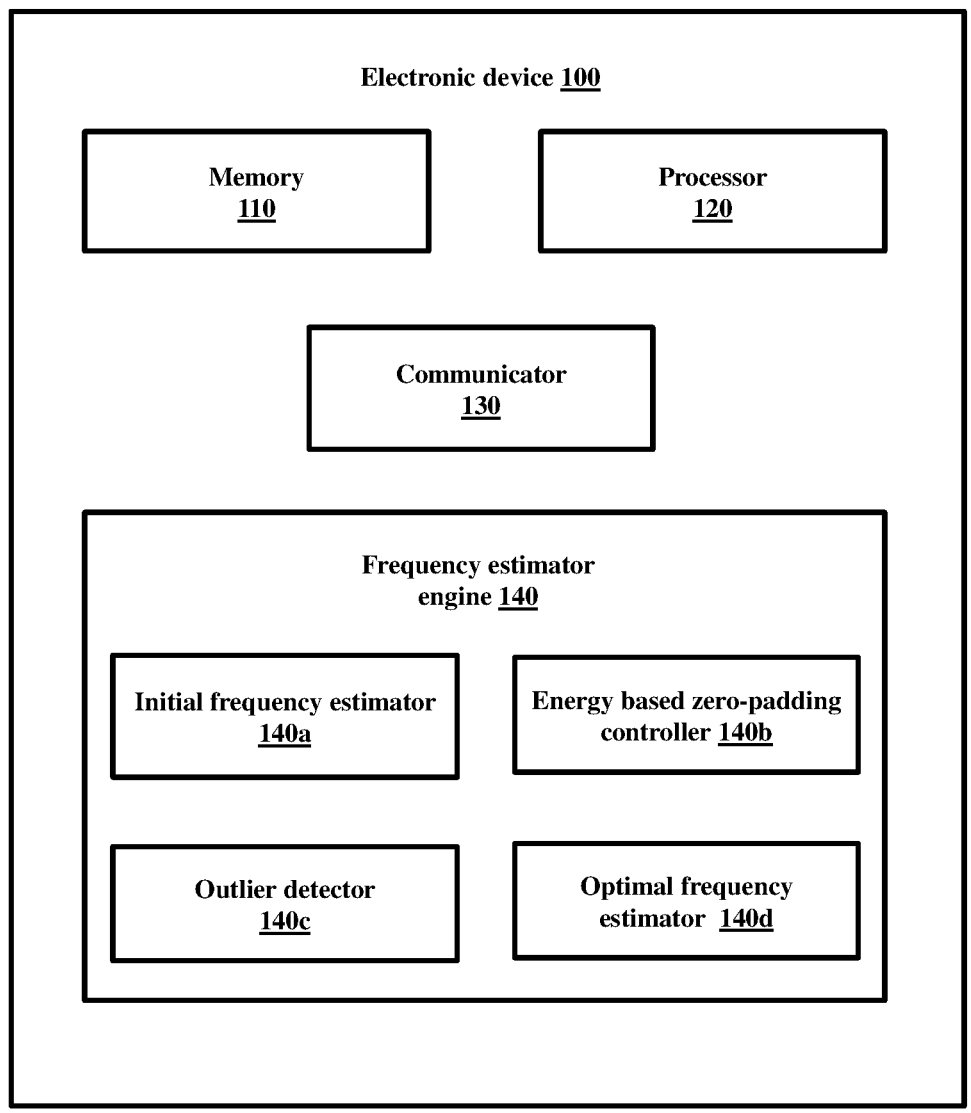
FIG. 3 illustrates a block diagram of an electronic device for estimating frequencies of multiple sinusoids, according to an embodiment as disclosed herein.
Figure 4:
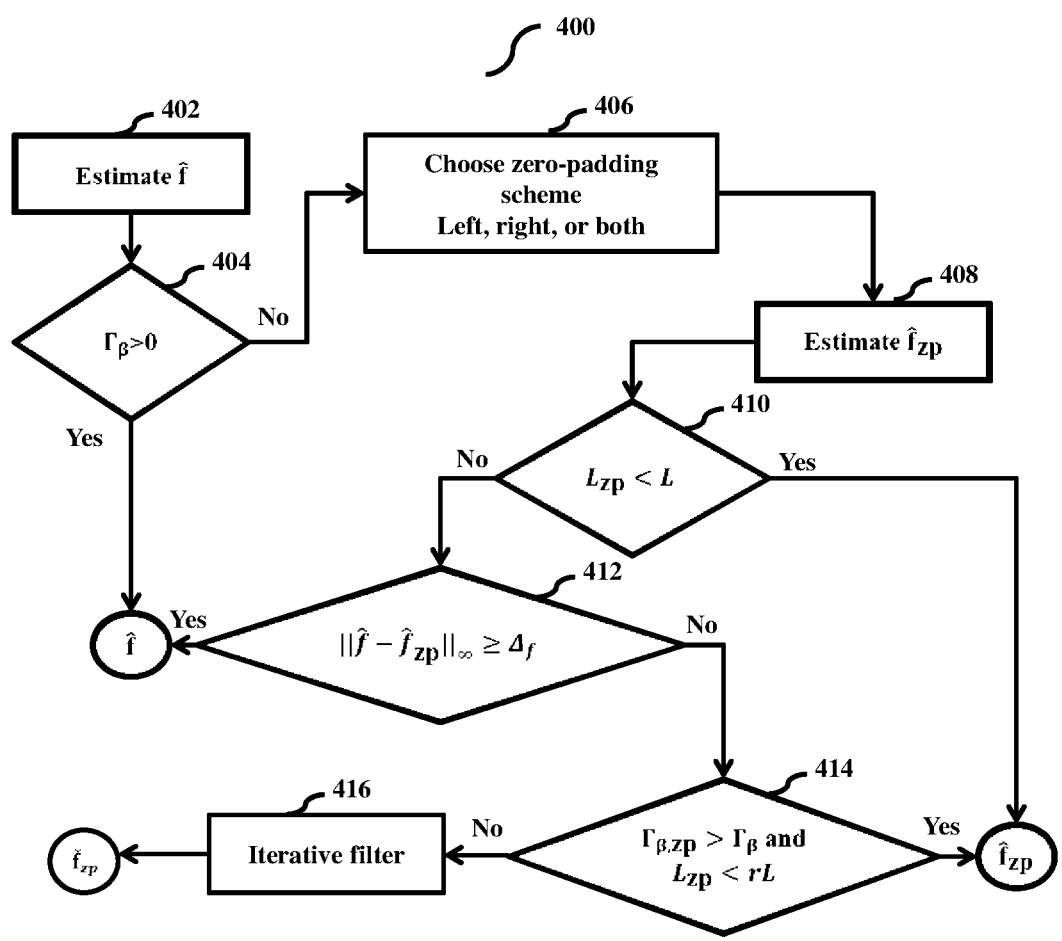
FIG. 4 is a flow diagram illustrating a method for estimating frequencies of multiple sinusoids, according to an embodiment as disclosed herein.
Figure 5:
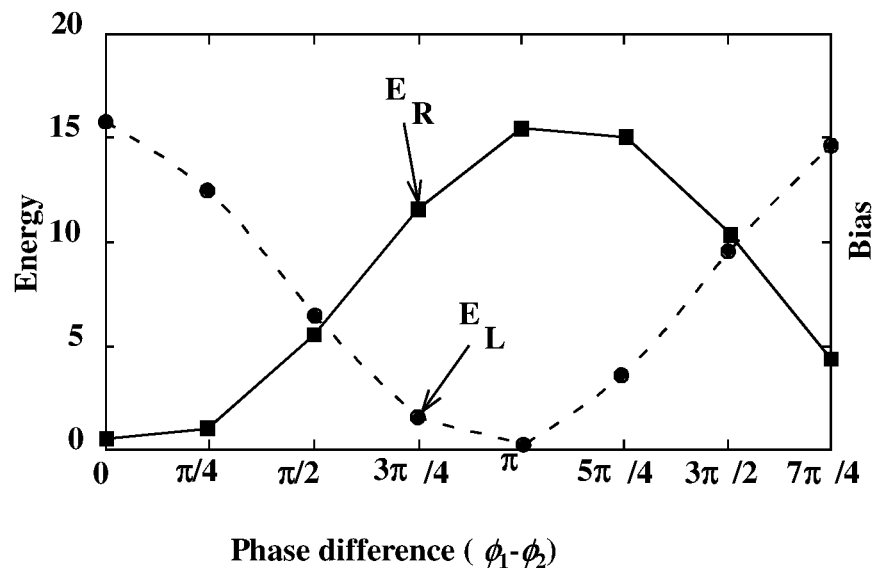
FIG. 5 illustrates energy levels $E_L$ and $E_R$ for the two-sinusoids for various phase differences and comparison of bias in the ESPRIT estimates for different zero-padding schemes (SNR=15 dB), according to an embodiment as disclosed herein.
Figure 5:
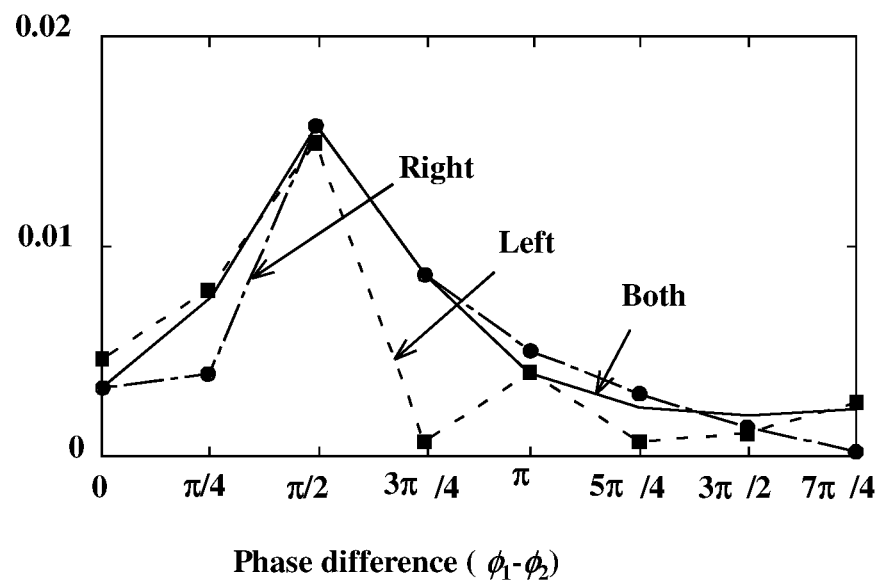

Referring now to the drawings, and more particularly to FIGS. 3 through 5, there are shown preferred embodiments.

FIG. 3 illustrates a block diagram of an electronic device (100) for estimating frequencies of multiple sinusoids, according to an embodiment as disclosed herein. The electronic device (100) can be, for example, but not limited to a smartphone, a smart watch, a computer, an IOT or a like.

In an embodiment, the electronic device (100) includes a memory (110), a processor (120), a communicator (130), and a frequency estimator engine (140).

The memory (110) also stores instructions to be executed by the processor (120). The memory (110) may include non-volatile storage elements. Examples of such non-volatile storage elements may include magnetic hard discs, optical discs, floppy discs, flash memories, or forms of electrically programmable memories (EPROM) or electrically erasable and programmable (EEPROM) memories. In addition, the memory (110) may, in some examples, be considered a non-transitory storage medium. The term "non-transitory" may indicate that the storage medium is not embodied in a carrier wave or a propagated signal. However, the term "non-transitory" should not be interpreted that the memory (110) is non-movable. In some examples, the memory (110) can be configured to store larger amounts of information than the memory. In certain examples, a non-transitory storage medium may store data that can, over time, change (e.g., in Random Access Memory (RAM) or cache). In an embodiment, the memory (110) can be an internal storage unit or it can be an external storage unit of the electronic device (100), a cloud storage, or any other type of external storage.

The processor (120) communicates with the memory (110), the communicator (130), and the frequency estimator engine (140). The processor (120) is configured to execute instructions stored in the memory (110) and to perform various processes. The communicator (130) is configured for communicating internally between internal hardware components and with external devices via one or more networks.

In an embodiment, the frequency estimator engine (140) includes an initial frequency estimator (140a), an energy-based zero-padding controller (140b), an outlier detector (140c), and an optimal frequency estimator (140d).

In an embodiment, the initial frequency estimator (140a) receives a signal, where the signal includes the multiple sinusoids. Further, the initial frequency estimator (140a) estimates initial frequencies (i.e. $\hat{f}$) of the received signal. Further, the initial frequency estimator (140a) determines a first candidate parameter (i.e., $\Gamma_\beta$), where the first candidate parameter is a function of an estimated SNR and an estimated threshold SNR.

In an embodiment, the energy-based zero-padding controller (140b) determines the energy levels of first few samples and last few samples of the received signal. Further, the energy-based zero-padding controller (140b) performs the zero-padding at left side of the received signal when the energy levels of the first few samples is lower than the energy levels of the last few samples. Further, the energy-based zero-padding controller (140b) performs the zero-padding at right side of the received signal when the energy levels of the first few samples is higher than the energy levels of the last few samples. Further, the energy-based zero-padding controller (140b) performs zero-padding at both sides of the received signal when the second candidate parameter value is less than zero. Further, the energy-based zero-padding controller (140b) does not perform zero-padding at both sides of the received signal when the second candidate parameter value is greater than zero. In an embodiment, the energy-based zero-padding controller (140b) re-estimates frequencies (i.e., $\hat{f}_{zp}$) obtained from zero-padded version of the received signal.

In an embodiment, the outlier detector (140c) predicts whether the initial frequencies and re-estimated frequencies from zero-padded version of the received signal are outliers based on validation criteria. Further, the outlier detector (140c) decides upon the re-estimated frequencies or the initial frequencies as optimal frequencies based on the validation.

In an embodiment, the outlier detector (140c) evaluates the likelihood function at the estimated initial frequencies and the re-estimated frequencies. Further, the outlier detector (140c) determines value of the likelihood function evaluated at the estimated initial frequencies (i.e., L) and value of the likelihood function evaluated at the re-estimated frequencies (i.e., $L_{zp}$). Further, the outlier detector (140c) determines a closeness between the estimated initial frequencies and the re-estimated frequencies when the value of the likelihood function evaluated at the estimated initial frequencies is lower than the value of the likelihood function evaluated at the re-estimated frequencies. Further, the outlier detector (140c) determines the re-estimated frequencies as the optimal frequencies when the value of the likelihood function evaluated at the estimated initial frequencies is higher than the value of the likelihood function evaluated at the re-estimated frequencies.

In an embodiment, the outlier detector (140c) determines a peak absolute difference between the estimated initial frequencies and the re-estimated frequencies (i.e., $\|\hat{f}-\hat{f}_{zp}\|_\infty$). Further the value of the likelihood function evaluated at the estimated initial frequencies is modified with a third candidate parameter (i.e., r). Further, the outlier detector (140c) determines the estimated initial frequencies as the optimal frequencies when the peak absolute difference is lower than a specified threshold value (i.e., $\Delta_f$). Further, the outlier detector (140c) determines whether a second candidate parameter (i.e., $\Gamma_{\beta,zp}$) value is higher than the first candidate parameter value and the modified value of the likelihood function evaluated at the estimated initial frequencies is higher than the value of the likelihood function evaluated at the re-estimated frequencies, when the peak absolute difference is higher than the specified threshold value.

In an embodiment, the optimal frequency estimator (140d) applies an iterative filtering when the second candidate parameter value is lower than the first candidate parameter value or the modified value of the likelihood function evaluated at the estimated initial frequencies is lower than the value of the likelihood function evaluated at the re-estimated frequencies. Further, the optimal frequency estimator (140d) determines the re-estimated frequencies as the optimal frequencies when the second candidate parameter value is higher than the first candidate parameter value and the modified value of the likelihood function evaluated at the estimated initial frequencies is higher than the value of the likelihood function evaluated at the re-estimated frequencies.

Although the FIG. 3 shows various hardware components of the electronic device (100) but it is to be understood that other embodiments are not limited thereon. In other embodiments, the electronic device (100) may include less or more number of components. Further, the labels or names of the components are used only for illustrative purpose and does not limit the scope of the invention. One or more components can be combined together to perform same or substantially similar function to estimate frequencies of multiple sinusoids.

FIG. 4 is a flow diagram 400 illustrating a method for estimating frequencies of multiple sinusoids, according to an embodiment as disclosed herein. The operations (402-416) are performed by the electronic device (100).

At 402, the method includes receiving the multiple sinusoids and estimating initial frequencies of multiple sinusoids using anyone of existing subspace method. The existing subspace method can be, for example, but not limited to an Estimation of Signal Parameters via Rotational Invariance Technique (ESPRIT), a Multiple Signal Classification (MUSIC), a Minimum-Norm (Min-Norm).

At 404, the method includes estimating both the SNR and threshold, and introducing a parameter $\Gamma_\beta$=Estimated SNR−Estimated Threshold. The results presented there indicate that $\Gamma_\beta$ can be used reliably for making the switch. It is defined as, $$\Gamma_\beta = 10\log_{10}\left[\frac{\frac{1}{M}\left(\lambda_p - \frac{1}{M-p}\sum_{k=p+1}^{M}\lambda_k\right)}{\frac{\beta}{M-p}\sum_{k=p+1}^{M}\lambda_k}\right] \quad (3)$$

Where $\lambda_k$, k=0,1, ..., M are the eigenvalues of $\hat{R}_{xx}$ arranged in descending order. The parameter $\beta$ is user-defined and, for $\beta$=1, has the interpretation of being ESPRIT's threshold values for the well-known two-sinusoid example. If $\Gamma_\beta$>0, the hypothesis is that the SNR is above threshold (high SNR regime) and confident that the conventional ESPRIT's estimate will be (nearly) optimal. As a result, no further processing is needed.

At 406-408, the method includes re-estimating frequencies when $\Gamma_\beta \leq 0$. The re-estimating frequencies obtained from a zero-padded version of the received signal. Zeros can be added either at the left- or right-end, or both ends and estimating the frequency $\hat{f}_{zp}$ using the zero-padding. Further, the zero-padding is describing in the FIG. 5.

At 410, the method includes comparing L and $L_{zp}$, which are the values of the likelihood cost function evaluated at the $\hat{f}$ and $\hat{f}_{zp}$. That is, $$L(f) = x^H(I - S(S^H S)^{-1} S^H) x \quad (4)$$

where $S = [e_1 \; e_2 \; \ldots \; e_p]$, $e_k = [1 \; e^{j2\pi f_k} \; \ldots \; e^{j2\pi(N-1)f_k}]^T$ and $x = (x[0] \; x[1] \; \ldots \; x[N-1])^T$. If $L_{zp} < L$, $\hat{f}_{zp}$ is taken as the final estimate At 412, the method includes determining closeness between $\hat{f}$ and $\hat{f}_{zp}$ ($\|\hat{f} - \hat{f}_{zp}\|_\infty < \Delta_f$). Where $\Delta_f$ is a user-defined parameter (the proposed method uses $\Delta_f = \frac{1}{2}N$). If $\|\hat{f} - \hat{f}_{zp}\|_\infty \geq \Delta_f$, conclude that the $\hat{f}$ is an outlier, which leaves us with the $\hat{f}_{zp}$. Either retain $\hat{f}_{zp}$ as the final estimate or improve upon it by an iterative filtering procedure.

At 414, the $\hat{f}_{zp}$ is the final estimate if $\Gamma_{\beta,zp} > \Gamma_\beta$ and $L_{zp} < r_L$. That is for the zero-padded data, not only does one rely upon the estimated SNR being greater than the estimated threshold, but also require that $L_{zp}$ "does not worsen too much". In the proposed method, r=2 is chosen as a user-defined parameter. At 416, the method includes applying the iterative filtering procedure when $\Gamma_{\beta,zp} \leq \Gamma_\beta$ or $L_{zp} \geq rL$ ($\hat{f}_{zp}$ is treated as a poor estimate that needs to be improved upon), which results in $\check{f}_{zp}$ as the final estimate.

In the iterative filtering procedure, filter out k($<p$) sinusoids from the data, thereby reducing the effective order and get better estimates of the remaining p–k sinusoids from the filtered data. The updated estimate is likely to be an improved one. The procedure is iterative where the likelihood cost is minimized during each iteration.

The iterative procedure starts off with an initial estimate $\check{f}_{zp}^0$, where the initial estimate $\check{f}_{zp}^0$ obtained by using a gradient-descent procedure on $L(\hat{f})$ with $\hat{f}_{zp}$ as the initial estimate. The chances of $\check{f}_{zp}^0$ being the global minimum are slim because $\hat{f}_{zp}$ is a poor initial guess. But the iterative filtering significantly improves upon it. In the $(i+1)^{th}$ iteration, the method tries to improve upon $\check{f}_{zp}^i$ as follows: Take k frequencies at a time from $\check{f}_{zp}^i$ for k=1,2, . . . , p–1 (Q=$2^p$–2 possibilities) and get a new estimate as follows.

Filtering: Let $S_l$ be formed from the $l^{th}$ subset of $\check{f}_{zp}^i$, where $l \in \{1, 2, \ldots, Q\}$, and filter out these sinusoids from the data x. The filtered signal $\tilde{x}$ is given by, $$\tilde{x} = (I - S_l(S_l^H S_l)^{-1} S_l^H) x \quad (5)$$

This can be interpreted as matrix notch filtering. The likelihood cost corresponding the filtered data is $\tilde{x}^H \tilde{x}$.

Estimation: Suppose k sinusoids have been removed from x, leaving p–k sinusoids in k. Apply any subspace-based method on k to re-estimate these p–k frequencies. In one embodiment ESPRIT-AC is used to re-estimate the p–k frequencies. These re-estimates, along with the k frequencies that were filtered out can be further improved using a gradient descent step (to reduce the likelihood cost further). The resultant estimate is denoted by $\tilde{f}_{zp}^l$.

Now a set of frequency estimates $\Omega = \{\tilde{f}_{zp}^1, \ldots, \tilde{f}_{zp}^Q\}$ is obtained. The one with the minimum likelihood cost is taken as $\check{f}_{zp}^{i+1}$, i.e., $$\check{f}_{zp}^{i+1} = \arg\min_{f \in \Omega} L(f) \quad (6)$$

If $L(\check{f}_{zp}^{i+1}) \geq L(\check{f}_{zp}^i)$, then the iteration is stopped and $\check{f}_{zp}^i$ will be taken as the final estimate (and relabeled as $\check{f}_{zp}$).

For example, four sinusoids f=[0.4505, 0.4755, 0.64, 0.7735]. Obtained initial estimate $\check{f}_{zp}^0 = [0.4786, 0.6028, 0.6358, 0.7739]$. Clearly, it is an outlier estimate. However, three of the estimated frequency values are close to true frequency values (0.4786 close to 0.4755, 0.6358 close to 0.64 and 0.7739 close to 0.7735). An improvement is obtained if the proposed method removes some of these "successful" frequencies (k) and then re-estimates the remaining frequencies (p–k). Removing the frequency of 0.4786 in the filtering step leads to a final estimate as $\check{f}_{zp}^1 = [0.451, 0.4726, 0.6396, 0.7744]$ which is better than $\check{f}_{zp}^0$. Removing the frequency of 0.6358 alone also results in the same $\check{f}_{zp}^1$. Also, some of the combinations of frequencies which includes 0.4786 or 0.6358 also leads to the same $\check{f}_{zp}^1$. On the other hand filtering of 0.7739 alone does not improve the result. Proposed method considers all the combinations of frequencies and the best one is chosen by comparing likelihood cost of resultant estimates.

FIG. 5 illustrates energy levels $E_L$ and $E_R$ for the two-sinusoids for various phase differences and comparison of bias in the ESPRIT estimates for different zero-padding schemes (SNR=15 dB), according to an embodiment as disclosed herein.

Zeros can be added either at one of the sides or at both sides of the received data (zero-padding at both sides results in ESPRIT-AC). The choice depends on the energy levels $E_L$ and $E_R$, where $E_L$ and $E_R$ are the energy of the first few and the last few samples of the data.

The notation "a" in the FIG. 5 shows the plot of $E_L$ and $E_R$ for various phase differences for the two-sinusoid example. In the example, uses 4 samples to compute $E_L$ and $E_R$ respectively. The notation "b" in the FIG. 5 shows the bias obtained for different zero-padding schemes. It is evident that whenever $E_L < E_R$ ($E_R < E_L$), zero-padding at the left end (right end) is better than other schemes. This is consistent with proposed method observation that better $\Gamma_\beta$ values were obtained when zero were padded at the low energy end. Intuitively, this corresponds to adding zeros at the end at which the added zeros result in the least abrupt change in the signal. Hence the proposed method chooses the zero-padding scheme by comparing $E_L$ and $E_R$, and checking the value of $\Gamma_\beta$. If $E_L < E_R$, the proposed method zero-pad at the left; otherwise zero-pad at the right. Further, the proposed method then checks the value of $\Gamma_\beta$ for the zero-padded data. If $\Gamma_\beta$ is still less than zero, the proposed method zero-pads at both ends.

The embodiments disclosed herein can be implemented using at least one software program running on at least one hardware device and performing network management functions to control the elements.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

We claim:

1. A method for estimating frequencies of multiple sinusoids, comprising:
   receiving, by an electronic device (100), a signal, wherein the signal comprises the multiple sinusoids;

estimating, by the electronic device (100), an initial frequency of each of the multiple sinusoids present in the received signal;

determining, by the electronic device (100), that a first candidate parameter is less than zero, wherein the first candidate parameter is a function of an estimated Signal-to-noise ratio (SNR) and an estimated threshold;

performing, by the electronic device (100), zero-padding on the received signal;

re-estimating, by the electronic device (100), frequencies obtained from zero-padded version of the received signal;

validating, by the electronic device (100), the re-estimated frequencies obtained from zero-padded version of the received signal based on validation criteria; and predicting, by the electronic device (100), the re-estimated frequencies or the initial frequencies as optimal frequencies based on the validation.

2. The method as claimed in claim 1, wherein validating the re-estimated frequencies obtained from zero-padded version of the received signal based on validation criteria comprises:

applying, by the electronic device (100), a likelihood function on the estimated initial frequencies and the re-estimated frequencies;

determining, by the electronic device (100), value of the likelihood function evaluated at the estimated initial frequencies and value of the likelihood function evaluated at the re-estimated frequencies; and performing, by the electronic device (100), one of:
  determining, by the electronic device (100), a closeness between the estimated initial frequencies and the re-estimated frequencies when the value of the likelihood function evaluated at the estimated initial frequencies is lower than the value of the likelihood function evaluated at the re-estimated frequencies; and
  determining, by the electronic device (100), the re-estimated frequencies as the optimal frequencies when the value of the applied likelihood function evaluated at the estimated initial frequencies is higher than the value of the likelihood function evaluated at the re-estimated frequencies.

3. The method as claimed in claim 2, wherein determining the closeness between the estimated initial frequencies and the re-estimated frequencies when the value of the likelihood function evaluated at the estimated initial frequencies is lower than the value of the likelihood function evaluated at the re-estimated frequencies, comprises:

determining, by the electronic device (100), a peak absolute difference between the estimated initial frequencies and the re-estimated frequencies;

modifying, by the electronic device (100), the value of the likelihood function evaluated at the estimated initial frequency by a third candidate parameter; and performing, by the electronic device (100), one of:
  determining, by the electronic device (100), the estimated initial frequencies as the optimal frequencies when the peak absolute difference is lower than a specified threshold value; and
  determining, by the electronic device (100), whether a second candidate parameter value is higher than the first candidate parameter value and the modified value of the likelihood function evaluated at the estimated initial frequencies is higher than the value of the likelihood function evaluated at the re-estimated frequencies, when the peak absolute difference is higher than the specified threshold value.

4. The method as claimed in claim 3, wherein determining whether the second candidate parameter value is higher than the first candidate parameter value and the modified value of the likelihood function evaluated at the estimated initial frequencies is higher than the value of the likelihood function evaluated at the re-estimated frequencies, comprises:

performing, by the electronic device (100), one of:
  applying, by the electronic device (100), an iterative filtering when the second candidate parameter value is lower than the first candidate parameter value or the modified value of the likelihood function evaluated at the estimated initial frequencies is lower than the value of the likelihood function evaluated at the re-estimated frequencies; and
  determining, by the electronic device (100), the re-estimated frequencies as the optimal frequencies when the second candidate parameter value is higher than the first candidate parameter value and the modified value of the likelihood function evaluated at the estimated initial frequencies is higher than the value of the likelihood function evaluated at the re-estimated frequencies.

5. The method as claimed in claim 4, wherein the iterative filtering refines the re-estimated frequencies to obtain the optimal frequencies.

6. The method as claimed in claim 4, wherein the iterative filtering comprises:

determining, by the electronic device (100), a subset of at least one re-estimated frequencies as optimal sinusoids;

removing, by the electronic device (100), the determined optimal sinusoids from the received signal;

re-estimating, by the electronic device (100), frequencies of the remaining sinusoids of the received signal;

combining, by the electronic device (100), the determined frequencies and re-estimate frequencies of the remaining sinusoids;

applying gradient, by the electronic device (100), using the combined frequencies set as the initial guess;

exhaustively, by the electronic device (100), cycle through all possible subsets of frequencies; and determining, by the electronic device (100), final estimate based on likelihood function evaluation.

7. The method as claimed in claim 1, wherein estimating the initial frequencies comprises using existing subspace method, wherein the existing subspace method comprises an Estimation of Signal Parameters via Rotational Invariance Technique (ESPRIT), a Multiple Signal Classification (MUSIC), and a Minimum-Norm (Min-Norm).

8. The method as claimed in claim 1, wherein the zero-padding is performed either at one side of the received signal or at both sides of the received signal.

9. The method as claimed in claim 1, wherein performing zero-padding on the received signal, comprises:

determining, by the electronic device (100), energy levels of first few samples and last few samples of the estimated frequencies;

performing, by the electronic device (100), one of:
  zero-padding, by the electronic device (100), at left side of the received signal when the energy levels of the first few samples is lower than the energy levels of the last few samples; and
  zero-padding, by the electronic device (100), at right side of the received signal when the energy levels of the first few samples is higher than the energy levels of the last few samples;

determining, by the electronic device (100), the second candidate parameter value; and performing, by the electronic device (100), one of:
- zero-padding, by the electronic device (100), at both sides of the received signal when the second candidate parameter value is less than zero; and
- zero-padding, by the electronic device (100), at both sides of the received signal is not required when the second candidate parameter value is greater than zero.

10. The method as claimed in claim 1, wherein the candidate parameter is a difference between estimated SNR and estimated threshold SNR.

11. An electronic device (100) for estimating frequencies of multiple sinusoids, comprising:
- a memory (110);
- a processor (120); and
- a frequency estimator engine (140), operably connected to the memory (110) and the processor (120), configured to:
  - receive a signal, wherein the signal comprises the multiple sinusoids;
  - estimate an initial frequency of each of the multiple sinusoids present in the received signal;
  - determine that a first candidate parameter is less than zero, wherein the first candidate parameter is a function of an estimated Signal-to-noise ratio (SNR) and an estimated threshold;
  - perform zero-padding on the received signal;
  - re-estimate frequencies obtained from the zero-padded version of the received signal;
  - validate the re-estimated frequencies obtained from the zero-padded version of the received signal based on validation criteria; and
  - predict the re-estimated frequencies or the initial frequencies as optimal frequencies based on the validation.

12. The electronic device (100) as claimed in claim 11, wherein validate the re-estimated frequencies obtained from the zero-padded version of the received signal based on validation criteria, comprises:
- apply a likelihood function on the estimated initial frequencies and the re-estimated frequencies;
- determine value of the likelihood function evaluated at the estimated initial frequencies and value of the likelihood function evaluated at the re-estimated frequencies; and
- perform one of:
  - determine a closeness between the estimated initial frequencies and the re-estimated frequencies when the value of the likelihood function evaluated at the estimated initial frequencies is lower than the value of the likelihood function evaluated at the re-estimated frequencies; and
  - determine the re-estimated frequencies as the optimal frequencies when the value of the applied likelihood function evaluated at the estimated initial frequencies is higher than the value of the likelihood function evaluated at the re-estimated frequencies.

13. The electronic device (100) as claimed in claim 12, wherein determine the closeness between the estimated initial frequencies and the re-estimated frequencies when the value of the likelihood function evaluated at the estimated initial frequencies is lower than the value of the likelihood function evaluated at the re-estimated frequencies, comprises:

- determine a peak absolute difference between the estimated initial frequencies and the re-estimated frequencies;
- modify value of the likelihood function evaluated at the estimated initial frequencies with a third candidate parameter; and
- perform one of:
  - determine the estimated initial frequencies as the optimal frequencies when the peak absolute difference is lower than a specified threshold value; and
  - determine whether a second candidate parameter value is higher than the first candidate parameter value and the modified value of the likelihood function evaluated at the estimated initial frequencies is higher than the value of the likelihood function evaluated at the re-estimated frequencies, when the peak absolute difference is higher than the specified threshold value.

14. The electronic device (100) as claimed in claim 13, wherein determine whether the second candidate parameter value is higher than the first candidate parameter value and the modified value of the likelihood function evaluated at the estimated initial frequencies is higher than the value of the likelihood function evaluated at the re-estimated frequencies, comprises:
- perform one of:
  - apply an iterative filtering when the second candidate parameter value is lower than the first candidate parameter value or the modified value of the likelihood function evaluated at the estimated initial frequencies is lower than the value of the likelihood function evaluated at the re-estimated frequencies; and
  - determine the re-estimated frequencies as the optimal frequencies when the second candidate parameter value is higher than the first candidate parameter value and the modified value of the likelihood function evaluated at the estimated initial frequencies is higher than the value of the likelihood function evaluated at the re-estimated frequencies.

15. The electronic device (100) as claimed in claim 14, wherein the iterative filtering refines the re-estimated frequencies to obtain the optimal frequencies.

16. The electronic device (100) as claimed in claim 14, wherein the iterative filtering comprises:
- determine a subset of at least one re-estimated frequencies as optimal sinusoids;
- remove the determined optimal sinusoids from the received signal;
- re-estimate frequencies of the remaining sinusoids of the received signal;
- combine the determined frequencies and re-estimate frequencies of the remaining sinusoids;
- apply gradient using the combined frequencies set as the initial guess;
- exhaustively cycle through all possible subsets of frequencies; and
- determine final estimate based on likelihood function evaluation.

17. The electronic device (100) as claimed in claim 11, wherein estimate the initial frequencies comprises using existing subspace method, wherein the existing subspace method comprises an Estimation of Signal Parameters via Rotational Invariance Technique (ESPRIT), a Multiple Signal Classification (MUSIC), and a Minimum-Norm (Min-Norm).

18. The electronic device (100) as claimed in claim 11, wherein the zero-padding is performed either at one side of the received signal or at both sides of the received signal.

19. The electronic device (100) as claimed in claim 11, wherein perform zero-padding on the received signal, comprises:
   determine energy levels of first few samples and last few samples of the estimated frequencies;
   perform one of:
      zero-padding at left side of the received signal when the energy levels of the first few samples is lower than the energy levels of the last few samples; and
      zero-padding at right side of the received signal when the energy levels of the first few samples is higher than the energy levels of the last few samples;
   determine the second candidate parameter value; and
   perform one of:
      zero-padding at both side of the received signal when the second candidate parameter value is less than zero; and
      zero-padding at both side of the received signal is not required when the second candidate parameter value is greater than zero.

20. The electronic device (100) as claimed in claim 11, wherein the candidate parameter is a difference between estimated SNR and estimated threshold.

* * * * *